United States Patent
Chen

(10) Patent No.: US 9,922,877 B2
(45) Date of Patent: Mar. 20, 2018

(54) CONNECTOR STRUCTURE AND METHOD FOR FABRICATING THE SAME

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 14/826,257

(22) Filed: Aug. 14, 2015

(65) Prior Publication Data

US 2017/0047245 A1    Feb. 16, 2017

(51) Int. Cl.
*H01L 23/52*   (2006.01)
*H01L 21/768*  (2006.01)
*H01L 27/11582* (2017.01)

(52) U.S. Cl.
CPC .. *H01L 21/76885* (2013.01); *H01L 21/76834* (2013.01); *H01L 27/11582* (2013.01)

(58) Field of Classification Search
CPC .......... H01L 21/76805; H01L 23/5226; H01L 23/528; H01L 21/76865; H01L 23/53271; H01L 23/5329; H01L 21/76877; H01L 23/53209
USPC ........................................ 257/754, 750, 741
See application file for complete search history.

(56) References Cited

U.S. PATENT DOCUMENTS

| | | | | |
|---|---|---|---|---|
| 5,243,220 A * | 9/1993 | Shibata | ................ | H01L 23/485 257/748 |
| 6,300,213 B1 * | 10/2001 | Dennison | .......... | H01L 27/10852 257/E21.648 |
| 2004/0140486 A1 * | 7/2004 | Lee | ................... | H01L 21/31144 257/208 |
| 2007/0069381 A1 * | 3/2007 | Lu | ....................... | H01L 21/7682 257/750 |
| 2012/0299069 A1 * | 11/2012 | Kuhn | ............... | H01L 21/76843 257/288 |
| 2013/0277852 A1 | 10/2013 | Chen | | |
| 2016/0020144 A1 * | 1/2016 | Lu | ..................... | H01L 29/66568 257/288 |

OTHER PUBLICATIONS

TIPO Office Action dated Nov. 8, 2016 in TW application (No. 104126173).

* cited by examiner

*Primary Examiner* — Selim Ahmed
(74) *Attorney, Agent, or Firm* — McClure, Qualey & Rodack, LLP

(57) ABSTRACT

A connector structure for electrically contacting with a conductive layer disposed on a substrate is provided. The connector structure comprises a conductive connecting element disposed on the substrate. The conductive connecting element comprises a connecting part and an extending part. The connecting part has a bottom portion electrically contacting with the conductive layer. The extending part laterally extends outwards from a top portion of the connecting part, and the extending part and the connecting part are respectively formed of different materials.

18 Claims, 5 Drawing Sheets

CONNECTOR STRUCTURE AND METHOD FOR FABRICATING THE SAME

BACKGROUND

Technical Field

The disclosure in generally relates to a connector structure and method for fabricating the same, and more particularly to a connector structure used in a three-dimensional (3D) memory device and method for fabricating the same.

Description of the Related Art

Recently, the development of a memory device is toward the three-dimensional (3D) memory devices, such as a Surrounding-Gate Vertical-Channel (SGVC) 3D NAND memory device having a multi-layer structure. This type of the 3D memory device can achieve higher storage content and has more excellent electrical characteristics, for example, having better data retention reliability and higher operating speed.

The 3D memory device generally comprises a multi-layered stacking structure and a plurality of memory strings longitudinally penetrating through the stacking structure. In general, a plurality of connector structures are needed to be formed on the stacking structure to electrically connect the memory strings and the other circuits. These days, the conventional connector structure has to be made in a more complicated process, and the fabricated connector structure may have some functional defects, such as having a capacitance value which is too high.

Therefore, there is a need of providing an improved connector structure and method for fabricating the same to obviate the drawbacks encountered from the prior art.

SUMMARY

A connector structure and a method for fabricating the same are provided in the present disclosure, to resolve a least a portion of the above problems.

According to an embodiment of the present invention, a connector structure for electrically contacting with a conductive layer disposed on a substrate is provided. The connector structure comprises a conductive connecting element disposed on the substrate. The conductive connecting element comprises a connecting part and an extending part. The connecting part has a bottom portion electrically contacting with the conductive layer. The extending part laterally extends outwards from a top portion of the connecting part, wherein the extending part and the connecting part are respectively formed of different materials.

According to an embodiment of the present invention, a method for fabricating a connector structure comprises the following steps. Firstly, a substrate having at least one conductive layer disposed thereon is provided. Next, at least one conductive connecting element on the substrate is formed to make the conductive connecting element having a connecting part and an extending part, wherein a bottom portion of the connecting part electrically contacts with the conductive layer, and the extending part laterally extends outwards from a top portion of the connecting part, and the extending part and the connecting part are formed of different materials.

BRIEF DESCRIPTION OF THE DRAWINGS

The above objects and advantages of the present invention will become more readily apparent to those ordinarily skilled in the art after reviewing the following detailed description and accompanying drawings, in which.

Figure 1A:
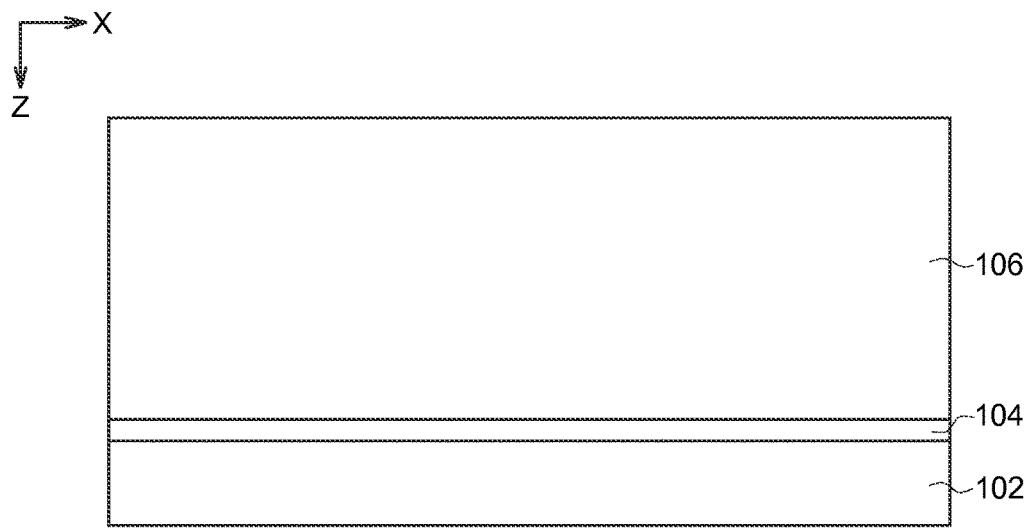
FIG. 1A to FIG. 1G are cross-section views illustrating a connector structure in accordance with one embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Now the description is directed to a connector structure and a method for fabricating the same. The connector structure and the method for fabricating the same can be applied in a 3D memory device, such as a 3D vertical channel memory device. However, this invention is not limited thereto. For example, the connector structure and the method for fabricating the same may be applied in other non-volatile memory, general memory, or general semiconductor structures.

FIG. 1A to FIG. 1G are cross-section views illustrating a connector structure 10 in accordance with one embodiment of the present invention. In the embodiment, the cross-section view is illustrated in a longitudinal cross-section, such as a plane formed by the x-axis and the z-axis, which is perpendicular to a plane formed by the x-axis and the y-axis.

Referring to FIG. 1A, a substrate 102 is provided. A conductive layer 104 disposed on the substrate 102, and a dielectric layer 106 covering the conductive layer 104 is formed.

In some embodiments, the substrate 102 can be formed of a dielectric material, such as an oxide.

In some embodiments, the conductive layer 104 is a metal wire or a poly-silicon channel layer. In some embodiments, a thickness of the conductive layer 104 can be 10 nm.

In some embodiments, the dielectric layer 106 can be a single-layered or a multi-layered structure formed of a silicon oxide or a silicon nitride. In the present embodiment, the dielectric layer 106 can be a silicon dioxide layer.

Figure 1B:
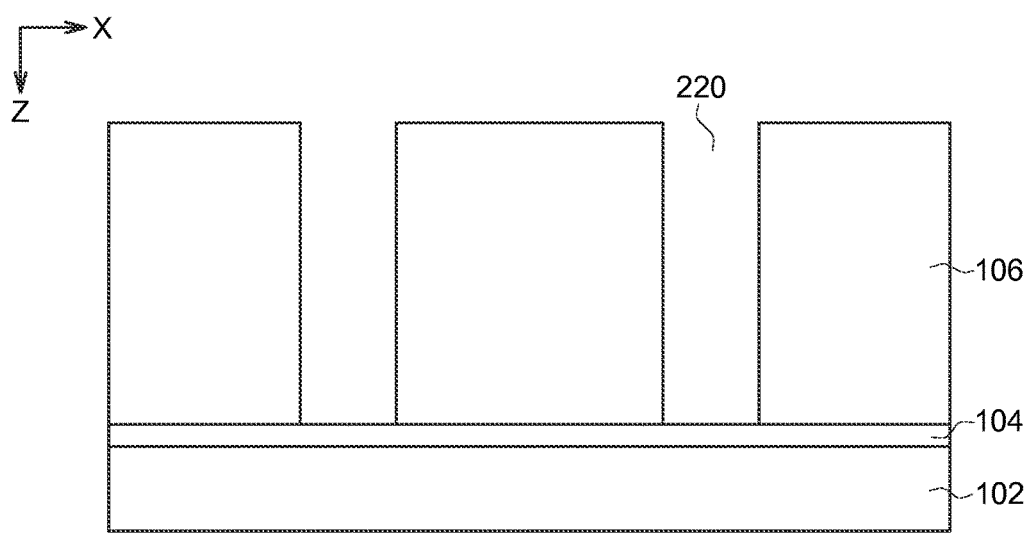
Figure 1C:
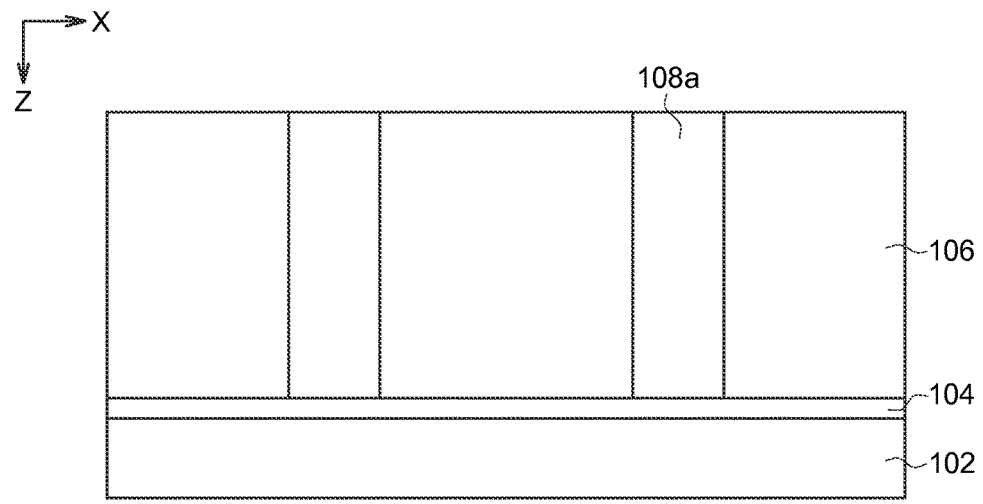

Referring to FIG. 1B, at least one opening 220 is formed to penetrate through the dielectric layer 106, and at least a portion of the conductive layer 104 is exposed. In some embodiments, a width of the opening 220 can be 30 nm.

Referring to FIG. 1O, a conductive material is filled in the opening 220 to form a connecting part 108a. In some embodiments, the connecting part 108a can be formed by a deposition process. In some embodiments, a width of the connecting part 108a can be 30 nm.

In some embodiments, the material of the connecting part 108a is formed of metal, metal oxide, metal silicide, or semiconductor or the arbitrary combinations thereof.

In some embodiments, the connecting part 108a is formed of a conductive material, such as the aluminum (Al), tungsten (W), titanium nitride (TiN), a heavily silicon-doped semiconductor; for example, the doping concentration of the silicon is larger than $10^{20}$ cm$^3$.

In some embodiments, the connecting part 108a can be a pillar structure. The connecting part 108a has a traverse cross-section, such as a plane formed by the x-axis and the y-axis, shaping as a circle, a polygon, or an ellipse.

Moreover, the connecting part 108a can be a ridged bar structure. For example, in other embodiments, the connecting parts 108a is a long narrow standing wall formed by the conductive material filled in the opening 220 having a trench shape.

Figure 1D:
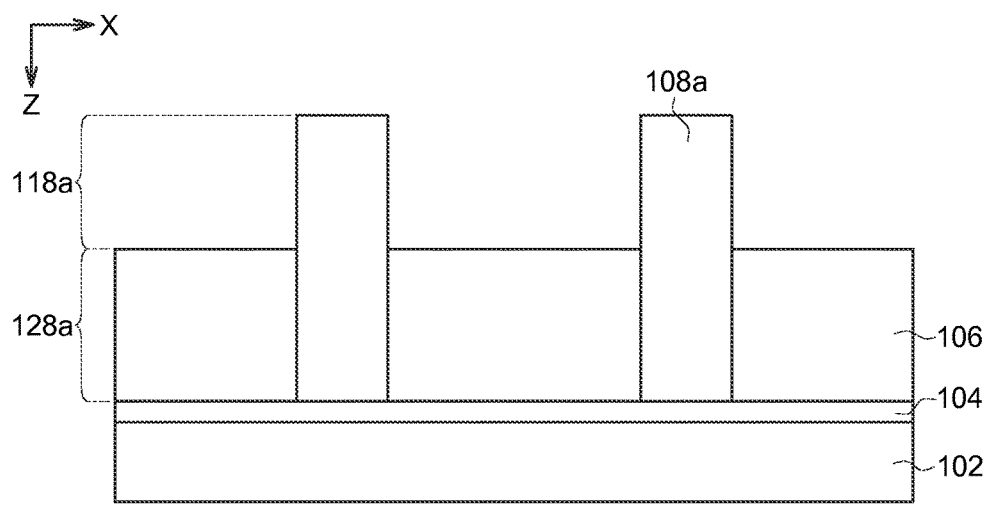

Referring to FIG. 1D, the dielectric layer 106 is partially removed to expose a top portion 118a of the connecting part 108a. The connecting portion 108a further comprises a bottom portion 128a, wherein the bottom portion 128a of the connecting portion 108a electrically contacts with the conductive layer 104.

In some embodiments, the dielectric layer 106 is partially removed by an etching back process. For example, in some embodiments of the present invention, an etchant for wet etching can be used to remove a portion of the dielectric layer 106 near the top portion 118a of the connecting part 108a. In some embodiments, a depth of the etching can be twice of the width of the connecting part 108a, such as 60 nm. In some embodiments, the additional etching mask is no needed when the dielectric layer 160 is partially removed. By using the connecting part 108a as the etching mask, the dielectric layer 106 can be partially removed in a self-aligned manner. In some embodiments, a height of the top portion 118a can be twice of the width of the connecting part 108a, such as 60 nm.

In some embodiments, the etching depth of the dielectric layer 106 can be controlled by disposing a stopping layer, or by the etching time (etching rate), or by an end point detection.

Figure 1E:
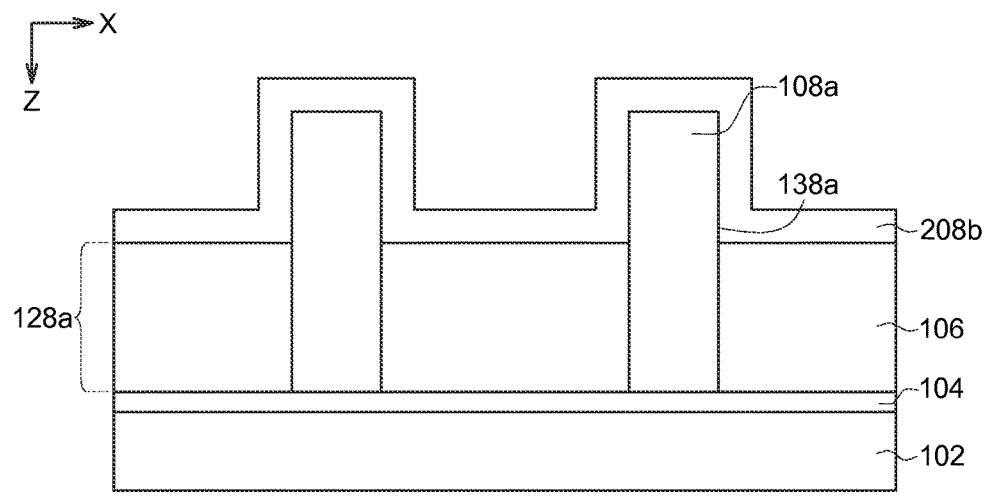
Figure 1F:
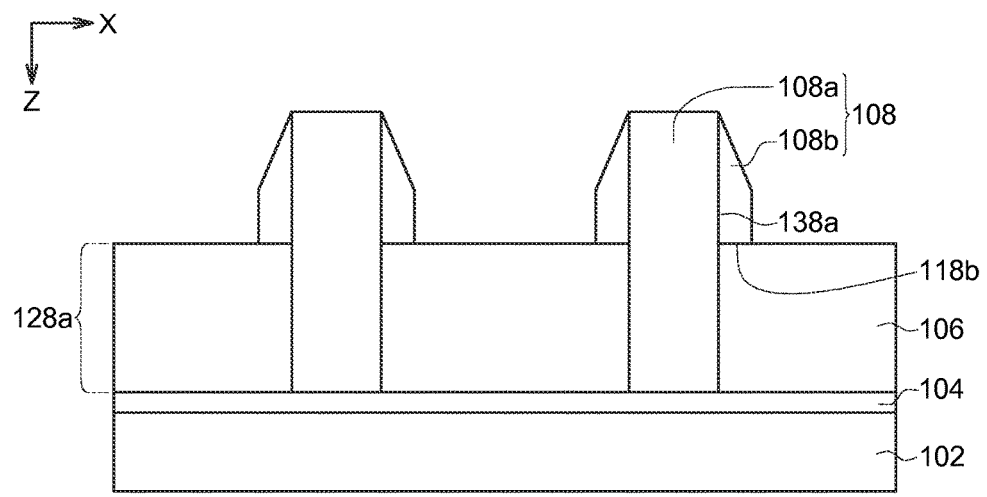

Referring to FIG. 1E, a thin film layer 208b is formed to cover the remaining dielectric layer 106 and the top portion 118a.

In some embodiments, the material of the thin film layer 208b can be metal, metal oxide, metal silicide, or semiconductor or the arbitrary combinations thereof. In some embodiments, the material of the thin film layer 208b can comprise a dielectric material, such as a silicon nitride (SiN).

In some embodiments, the thin film layer 208b can be formed by a deposition process. In some embodiments, a thickness of the thin film layer 208b can be ⅓ of the width of the connecting part, such as 10 nm Referring to FIG. 1F, a portion of thin film layer 208b is removed to form a self-aligned spacer at a sidewall 138a of the top portion 118a, but not limited thereto, and the extending part 108a is formed on the sidewall 138a of the top portion 118a of the connecting part 108a. The extending part 108b laterally extends outwards from the top portion 118a of the connecting part 108a, such as along the x-axis direction. The connecting part 108a and the extending part 108b form a conductive connecting element 108 together. In some embodiments of the present invention, the self-aligned spacer is formed by an etching back process to remove a portion of the thin film layer 208b. In some embodiments, a photoresist etching process can also be performed to remove a portion of the thin film layer 208b.

In the embodiment, the extending part 108b and the connecting part 108a are formed of different materials. In some embodiments, the material of the extending part 108b is metal, metal oxide, metal silicide, or semiconductor or the arbitrary combinations thereof. In some embodiments, the material of the extending part 108b is a conductive material, such as the titanium nitride (TiN), tantalum nitride (TaN), or the silicon-doped semiconductor material.

In some embodiments, the material of the extending part 108b is a dielectric material, such as silicon nitride (SiN).

In some embodiments, the extending part 108b has an upper width W1 and a lower width W2, and the upper width W1 is equal to or smaller than the lower width W2.

In some embodiments, the connecting part 108a penetrates through the dielectric layer 106 disposed on the substrate 102 and electrically contacts with the conductive layer 104.

In some embodiments, the conductive connecting element 108 substantially has a T-shaped longitudinal section.

Figure 1G:
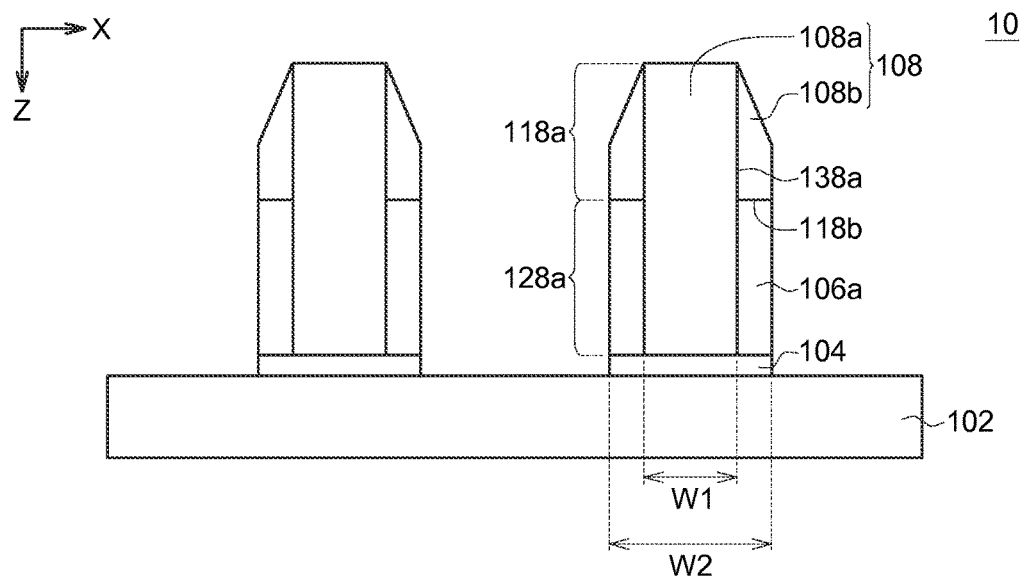

Referring to FIG. 1G, using the conductive connecting element 108 as an etching mask to remove a portion of the dielectric layer 106 and to form a dielectric spacer 106a. The dielectric spacer 106a connects to a bottom surface 118b of the extending part 108b and the sidewall 138a of the connecting part 108a. In some embodiments, a portion of the conductive layer 104 is also can be removed in this step; that is, a portion of the conductive layer 104 and a portion of the dielectric layer 106 can be removed concurrently. In the present embodiment, the step of removing a portion of the dielectric layer 106 and a portion of the conductive layer 104 can be performed by an etching process, such as an anisotropic etching process. During the process of removing a portion of the dielectric layer 106 and a portion of the conductive layer 104, additional etching mask is not needed, and the etching can be performed by directly using the extending part 108b as an etching mask in a self-aligned manner. In this way, the number of the etching mask can be reduced to lower down the cost, and the alignment challenge resulted from disposing the additional etching mask can be diminished.

In some embodiments, it is worth to be noted that the other areas in the dielectric layer 106 and the conductive layer 104 apart from the connecting part 108a and the extending part 108b can also be removed by the other methods, but not limited to the method that using the extending part 108b as an etching mask described above.

Figure 2:
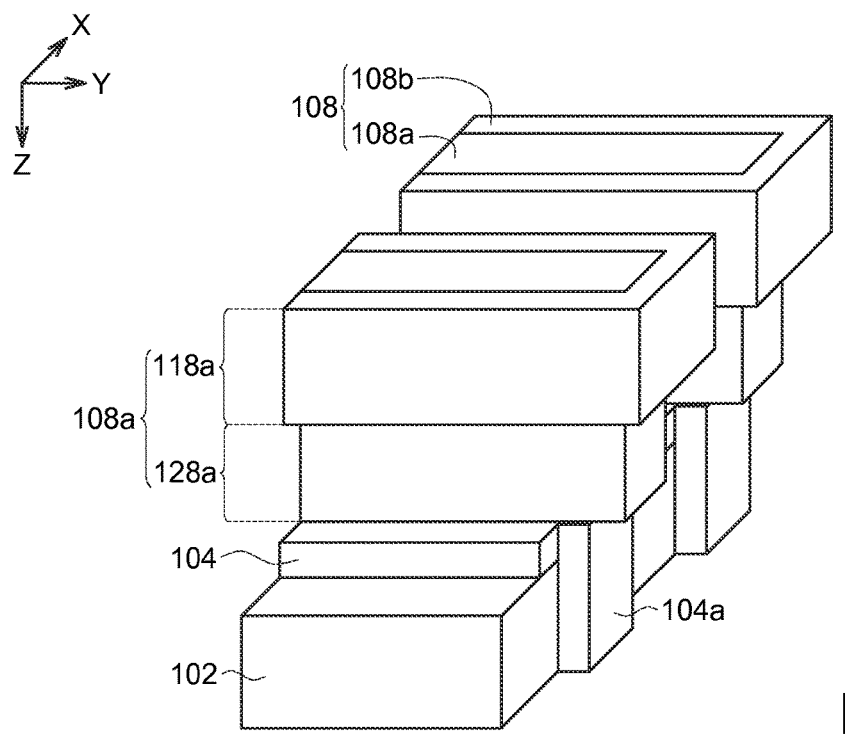
FIG. 2 is a side view illustrating a connector structure in accordance with one embodiment of the present invention.

FIG. 2 is a side view illustrating a connector structure in accordance with one embodiment of the present invention.

Referring to FIG. 2, a connector structure 10 is used to electrically contact with a conductive layer 104 disposed on the substrate 102. The connector structure 10 comprises a conductive connecting element 108 disposed on the substrate 102. The conductive connecting element 108 comprises a connecting part 108a and an extending part 108b. The connecting part 108a has a bottom portion 128a, and the bottom portion 128a electrically contacts with the conductive layer 104. The extending part 108b laterally extends outwards from a top portion 118a of the connecting part 108a, such as along the x-axis direction, and the extending part 108b and the connecting part 108a are formed of different materials.

In some embodiments, the connector structure 10 can be applied in the 3D memory device. Such as, the connector structure 10 is disposed on the vertical channel of the SGVC 3D NAND. For example, a conductor 104a can be formed in the substrate 102 to electrically connect the connector structure 10 and a channel layer (not shown) of the 3D memory device.

Figure 3:
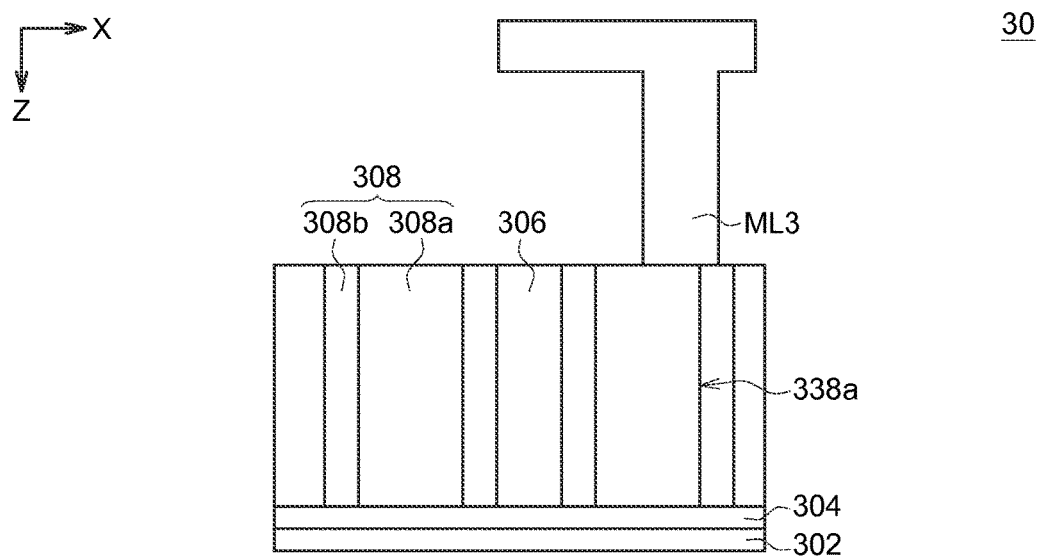
FIG. 3 is a cross-section view illustrating a connector structure in accordance with one comparative example.

FIG. 3 is a cross-section view illustrating a connector structure in accordance with one comparative example.

In one comparative example, referring to FIG. 3, the connector structure 30 comprises a conductive connecting element 308 disposed on the substrate 302. The conductive connecting element 308 comprises a connecting part 308a and an extending part 308b. The connecting part 308a electrically contacts with the conductive layer 304. The connecting part 308a and the extending part 308b penetrate through the dielectric layer 306. The extending part 308b covers the entire lateral surface 338a of the connecting part 308a, and the extending part 308b is formed of the dielectric materials. A metal layer ML3 is further formed on the connector structure 30 to electrically connect to the other circuits (not shown). Since the extending part 308b covers the entire lateral surface 338a of the connecting part 308a, a higher capacitance value C1 may be produced, and it may result in the problems about the increasing power consumption and the decreasing operating speed of the memory device. In one embodiment of the present invention, since the extending part laterally extends outwards from the top portion of the connecting part, the extending part does not cover the entire lateral surface of the connecting part. Even if the connecting part comprises a dielectric material, the produced capacitance value can be relatively lower.

Figure 4:
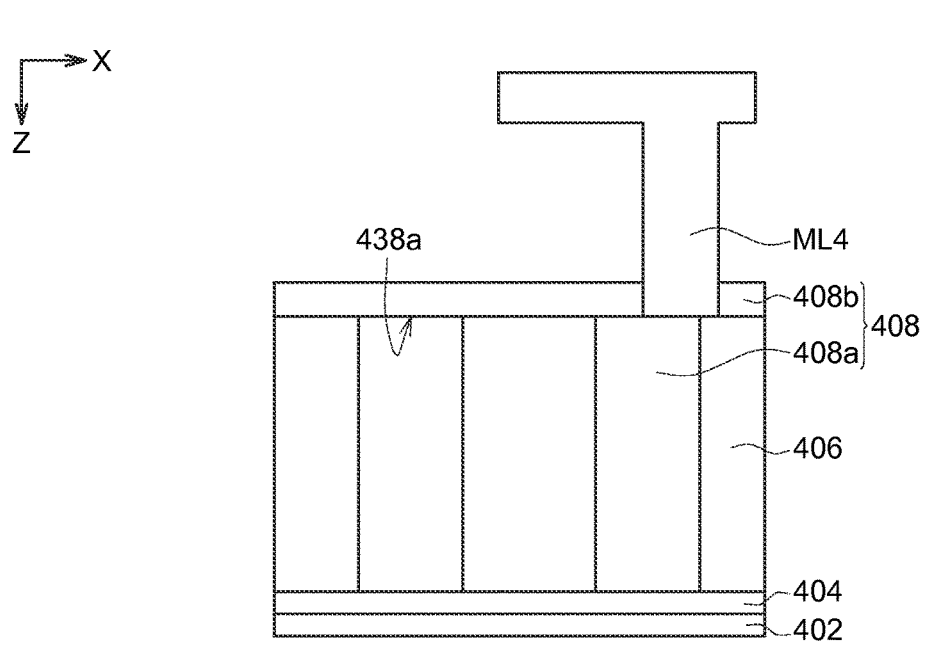
FIG. 4 is a cross-section view illustrating a connector structure in accordance with one comparative example.

FIG. 4 is a cross-section view illustrating a connector structure in accordance with one comparative example. In one comparative example, referring to FIG. 4, the connector structure 40 comprises a conductive connecting element 408 disposed on the substrate 402. The conductive connecting element 408 comprises a connecting part 408a and an extending part 408b. The connecting part 408a electrically contacts with the conductive layer 404. The connecting part 408a penetrates through the dielectric layer 406. The extending part 408b extends over the dielectric layer 406 and the connecting part 408a, and covers the dielectric layer 406 and the entire upper surface 438a of the connecting part 408a, and the extending part 408b is formed of the dielectric materials. A metal layer ML4 penetrating through the extending part 408b is further formed on the connector structure 40 to electrically connect to the other circuits (not shown). Since the extending part 408b extends over the connecting part 408a to cover the dielectric layer 406 and the entire upper surface 438a of the connecting part 408a, a higher capacitance value C2 may be produced, and it may result in the problems about the increasing power consumption and the decreasing operating speed of the memory device. In one embodiment of the present invention, since the extending part laterally extends outwards from the top portion of the connecting part in a transverse direction, the extending part does not cover the dielectric layer and the entire upper surface of the connecting part. Even if the connecting part comprises a dielectric material, the produced capacitance value can be relatively lower.

According to embodiments described above, a connector structure and a method for fabricating the same are provided in the present invention. The connector structure is used to electrically contact with a conductive layer disposed on a substrate. The connector structure comprises a conductive connecting element disposed on the substrate. The conductive connecting element comprises a connecting part and an extending part. The connecting part has a bottom portion electrically contacting with the conductive layer. The extending part laterally extends outwards from a top portion of the connecting part, such as along an x-axis direction. The extending part and the connecting part are respectively formed of different materials. Since the extending part can be used as an etching mask in the following process, so that the etching process, such as etching the dielectric layer and the conductive layer, can be performed in a self-aligned manner, and it is not needed to dispose additional etching mask. In this way, the number of the etching mask can be reduced to lower down the cost, and the alignment challenge resulted from disposing the additional etching mask can be diminished.

Moreover, since the extending part laterally extends outwards from a top portion of the connecting part, the extending part does not cover the entire lateral surface of the connecting part or cover the dielectric layer and the entire upper surface of the connecting part. In some embodiments, even if the material of the extending part disposed on the top portion of the connecting part comprises a dielectric material, the produced capacitance value can be decreased comparing to the comparative examples having a extending part covering the entire lateral surface of the connecting part or covering the dielectric layer and the entire upper surface of the connecting part. Therefore, the problems about the increasing power consumption and the decreasing operating speed of the memory device described above can be resolved. Furthermore, since the extending part can comprise a dielectric material, it can avoid the over etching problem when the metal layer is formed on the connector structure to electrically connect to other circuits.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A connector structure for electrically contacting with a conductive layer disposed on a substrate, comprising:
   a conductive connecting element disposed on the substrate, and the conductive connecting element comprising:
   a connecting part having a bottom portion electrically contacting with the conductive layer; and
   an extending part laterally extending outwards from a top portion of the connecting part, wherein the extending part and the connecting part are respectively formed of different materials, and the connecting part is surrounded by the extending part,
   wherein the connecting part and the extending part are non-overlapping,
   wherein the extending part has a lower width, and the lower width is equal to a width of the conductive layer disposed above the substrate.

2. The connector structure according to claim 1, wherein the extending part has an upper width, and the upper width is equal to or smaller than the lower width.

3. The connector structure according to claim 1, wherein the connecting part penetrates through a dielectric layer disposed on the substrate and electrically contacts with the conductive layer.

4. The connector structure according to claim 1, wherein the conductive layer is a metal wire or a poly-silicon channel layer.

5. The connector structure according to claim 1, wherein the connecting part comprises a material selected from a group consisted of metal, metal oxide, metal silicide, semiconductor and an arbitrary combinations thereof.

6. The connector structure according to claim 1, wherein the connecting part is a pillar structure.

7. The connector structure according to claim 6, wherein the connecting part has a traverse cross-section shaping as a circle, a polygon or an ellipse.

8. The connector structure according to claim 1, wherein the connecting part is a ridged bar structure.

9. The connector structure according to claim 1, wherein the extending part is made of a material selected from a group consisted of metal, metal oxide, metal silicide, semiconductor and the arbitrary combinations thereof.

10. The connector structure according to claim 1, wherein the extending part comprises a dielectric material.

11. The connector structure according to claim 1, wherein the conductive connecting element has a T-shaped longitudinal section.

12. The connector structure according to claim 1, further comprising a dielectric spacer connecting to a bottom surface of the extending part and at least one sidewall of the connecting part.

13. A method for fabricating a connector structure, comprising:
providing a substrate having at least one conductive layer disposed thereon;
forming at least one conductive connecting element on the substrate to make the conductive connecting element having a connecting part and an extending part, wherein a bottom portion of the connecting part electrically contacts with the conductive layer, and the extending part laterally extends outwards from a top portion of the connecting part, and the extending part and the connecting part are formed of different materials, and the connecting part is surrounded by the extending part,
wherein the connecting part and the extending part are non-overlapping,
wherein the extending part has a lower width, and the lower width is equal to a width of the conductive layer disposed above the substrate.

14. The method according to claim 13, wherein the step of forming the conductive connecting element further comprising:
forming a dielectric layer covering the conductive layer;
forming at least one opening penetrating through the dielectric layer and exposing at least a portion of the conductive layer;
filling a conductive material in the at least one opening to form the connecting part; and
forming the extending part on at least one sidewall of the top portion.

15. The method according to claim 14, wherein the step of forming the extending part further comprising:
removing a portion of the dielectric layer to expose the top portion;
forming a thin film layer covering the dielectric layer and the top portion; and
removing a portion of the thin film layer to form at least one self-aligned spacer on at least one sidewall of the bottom portion.

16. The method according to claim 15, wherein the thin film layer comprises a material selected from a group consisted of metal, metal oxide, metal silicide, semiconductor and an arbitrary combinations thereof.

17. The method according to claim 15, wherein the thin film layer comprises a dielectric material.

18. The method according to claim 14, wherein after the forming of the extending part further comprises:
using the extending part as an etching mask to remove a portion of the dielectric layer and to form at least one dielectric spacer.

* * * * *